United States Patent
Abadeer et al.

(12)

(10) Patent No.: US 6,714,113 B1
(45) Date of Patent: Mar. 30, 2004

(54) INDUCTOR FOR INTEGRATED CIRCUITS

(75) Inventors: Wagdi Abadeer, Jericho, VT (US);
Robert A. Groves, Highland, NY (US);
Patrick Hansen, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 09/712,369

(22) Filed: Nov. 14, 2000

(51) Int. Cl.$^7$ ............................................. H01F 27/28
(52) U.S. Cl. ..................... 336/223; 336/200; 336/225; 336/232; 257/531; 257/758
(58) Field of Search ................. 336/223, 200, 336/225, 232; 257/531, 758

(56) References Cited

U.S. PATENT DOCUMENTS

| | | | |
|---|---|---|---|
| 5,070,317 A | 12/1991 | Bhagat | 336/200 |
| 5,083,236 A | 1/1992 | Chason et al. | 361/401 |
| 5,095,357 A * | 3/1992 | Andoh et al. | 257/379 |
| 5,227,659 A | 7/1993 | Hubbard | 257/531 |
| 5,384,274 A | 1/1995 | Kanehachi | 437/47 |
| 5,387,551 A | 2/1995 | Mizoguchi et al. | 437/209 |
| 5,446,311 A | 8/1995 | Ewen et al. | 257/531 |
| 5,478,773 A | 12/1995 | Dow et al. | 437/60 |
| 5,541,135 A | 7/1996 | Pfeifer et al. | 437/60 |
| 5,545,916 A | 8/1996 | Koullias | 257/531 |
| 5,559,360 A | 9/1996 | Chiu et al. | 257/531 |
| 5,614,743 A | 3/1997 | Mochizuki | 257/276 |
| 5,618,777 A * | 4/1997 | Hey-Shipton et al. | 505/210 |
| 5,629,553 A | 5/1997 | Ikeda et al. | 257/531 |
| 5,656,849 A | 8/1997 | Burghartz et al. | 257/528 |

(List continued on next page.)

OTHER PUBLICATIONS

T. Yoshitomi, et al.; "On Chip Spiral Inductors with Diffused Shields Using Channel–Stop Implant," Tech Dig. Int. Electron Devices Meeting (IEDM), 1998, pp 540–543.

(List continued on next page.)

*Primary Examiner*—Lincoln Donovan
*Assistant Examiner*—Jennifer A. Poker
(74) *Attorney, Agent, or Firm*—Anthony J. Canale (57) ABSTRACT

An inductor is integrated in VLSI and ULSI technology products for very high frequency applications. The inductor is in a microstrip transmission line configuration which can be designed in a form of straight line, spiral line or Meander line. The inductor is formed by shorting the microstrip center conductor to the lower level ground plane at one end of the transmission line. This results in an inductance which, for a given design of transmission line, and in a specified frequency range, is independent of frequency, within the operating design range. The microstrip transmission line provides an inductance which could be used on any type of substrate, with either low or high resistivity. The microstrip transmission line could utilize two or all of the metal wiring levels of the technology, allowing a wide range of inductance and quality factor design tradeoffs. An important feature in this trade-off is the ability to utilize lower (below the inductor) metal wiring levels, as well as lower silicon and polysilicon areas for other than inductor design purposes, without affecting the operation of the inductor. This is because of the isolation properties of this inductor system. By utilizing isolation layers with low relative dielectric constant, Further enhancements of the system are achieved. The inductance of this system is constant within 10% over a frequency range extending from about 8 GHz to about 35 GHz This inductor system allows the design to be optimized, through several parameters, to achieve the desired performance.

11 Claims, 10 Drawing Sheets

U.S. PATENT DOCUMENTS

| | | | |
|---|---|---|---|
| 5,712,184 A | 1/1998 | Kaiser | 437/62 |
| 5,788,854 A | 8/1998 | Desaigoudar et al. | 216/13 |
| 5,793,272 A | 8/1998 | Burghartz et al. | 336/200 |
| 5,801,100 A | 9/1998 | Lee et al. | 438/678 |
| 5,861,647 A | 1/1999 | Zhao et al. | 257/296 |
| 5,898,991 A | 5/1999 | Fogel et al. | 29/602.1 |
| 5,917,244 A | 6/1999 | Lee et al. | 257/762 |
| 6,175,727 B1 * | 1/2001 | Mostov | 455/307 |
| 6,466,112 B1 * | 10/2002 | Kwon et al. | 333/243 |

OTHER PUBLICATIONS

R.D. Lutz, et al., "Modeling and Analysis of Multilevel Spiral Inductors For RFICS," Microwave Symposium Digest, 1999 IEEE MTT–S Internation, pp. 43–46, May 1999.

M.S. Sunderarajan, et al., "Simple Accurate Expressions for Planar Spiral Inductances," IEEE Journal of Solid–State Circuits, vol. 34, No. 10, pp. 1419–1424, Oct. 1999

J.N. Burghartz, et al., "Microwave Inductors and capacitors in Standard Multilevel Interconnect Silicon Technology," IEEE Transactions on Microwave Theory and Techniques, vol. 44, No. 1, pp. 100–104, Jan. 1996.

J.N. Burghartz, et al., "Multilevel–Spiral Inductors Using VLSI Interconnect Technology," IEEE ElectronDevice Letters, vol. 17, No. 9, pp. 428–430, Sep. 1996.

M. Hirano, et al., "Three–Dimensional Passive Elements for Compact GaAs MMICs," IEICE Trans. Electron. (Japan), vol. E76C, No. 6, pp. 961–967, Jun. 1993.

J.N. Burghartz, et al., "Monolithic Spiral Inductors Fabricated Using a VLSI Cu–Damascene Interconnect Technology and Low–Loss Substrates," Tech. Dig. Int. Electron Devices Meeting (IEDM), 1996, pp. 99–102.

C.W. Davidson, Transmission Lines for Communications, Wiley, New York, 1978, Section 1.3.3, pp. 13–18.

* cited by examiner

INDUCTOR FOR INTEGRATED CIRCUITS

BACKGROUND OF THE INVENTION

1. Field of the Invention

This invention relates to enhancements to inductors for integrated circuit technology and more particularly to structures and methods of making inductors which do not provide a major impact on conventional semiconductor manufacturing techniques.

2. Description of the Prior Art

Producing an on-chip inductor, incorporated with modem integrated circuits is highly desirable for many applications.

One main disadvantage to integrating inductors, particularly over low resistivity substrates, is that significant electric and magnetic field coupling takes place between the inductor element and the conductive substrate. First, this tends to minimize the achieved inductance, since any induced current in the substrate will have a magnetic field oriented in opposition to the magnetic field of the inductor (Lenz's Law). This opposition to the magnetic field of the inductor causes a reduction of the overall magnetic field with increasing frequency, yielding a varying effective inductance. Second, the currents generated in the substrate (either from magnetic or electric fields) lead to power loss (lowered quality factor) and noise coupling.

Prior art, U.S. Pat. No. 5,446,311, by Ewen, Ponnapalli and Soyuer, describes a system for obtaining High Q (quality factor) inductors in silicon technology without expensive metalization. The inductor is formed as a spiral conductor configuration with multiple metal levels in a conventional integrated circuit technology in which inductor turns utilize the multiple metal levels to reduce the inductor resistance. This prior art has limitations in that there would be strong electrical coupling between the inductor and the substrate. Thus a high resistivity substrate (about 10 ohm-cm or higher) would be more suitable for this prior art to produce a reasonable value of Quality Factor (Q) above 5. Also, this system produces a quality factor of only above 5, at radio and microwave frequencies. Using substrates with lower resistivity (example 0.01 ohm-cm) would reduce the quality factor significantly due to eddy currents generated in the substrate.

U.S. Pat. No. 5,083,226, employs dielectric substrate layers, not semiconductor integrated chips, and electronic components are mounted within the inductor volume.

U.S. Pat. No. 5,861,647, inductors are formed using plugs that connect two metal layers. This art requires a special thickness for the interlevel dielectric insulation, which presents a limitation to scaling to smaller devices and extending the operating range of the art.

U.S. Pat. No. 5,917,244, requires special processing with electroless plating method and a nickel containing conductor layer over the substrate layer. U.S. Pat. No. 5,478,773, also requires special processing with plated copper to a thickness of several microns. U.S. Pat. No. 5,793,272, also requires special processing using ferromagnetic cores and a ferromagnetic liner.

U.S. Pat. No. 5,788,854, also has limitations as far as processing is concerned, where an inductor is initially fabricated on a substrate and then integrated with other devices subsequently formed on the substrate. The process steps used to fabricate such other devices utilize temperatures sufficiently low to prevent damaging or destroying the characteristics of the inductor.

In U.S. Pat. No. 5,712,184, special processing is employed where a large number of monocrystalline silicon islands are generated, which silicon islands are insulated from the substrate wafer by means of a dielectric layer, and from each other by means of vertical dielectric material. Also in this prior art, substrates with high resistivity are used, posing another limitation on the invention.

In U.S. Pat. No. 5,656,849, a spiral inductor is presented, but also the inductor in this prior art is not isolated from the substrate.

In U.S. Pat. No. 5,541,135, an inductor requires special processing using electroplating to produce Flip Chip Bumps. U.S. Pat. No. 5,898,991, presents an inductor requiring very special processing producing a structure in which one or more concentric conductive elements are replaced by one or more solid electrically conductive "pins" or "posts" to provide electrical connection between the circuits on each side of a magnetic substrate.

In U.S. Pat. No. 5,801,100, again special processing is required using electroless copper plating to form a nickel containing conductive layer over the substrate layer.

Several references teach alternate forms based on the spiral inductor art, mostly to reduce the series resistance and improve the inductor quality factor. In the article "On-Chip Spiral Inductors with Diffused Shields Using Channel- Stop Implant," T. Yoshitomi, et al.; *Tech. Dig. Int. Electron Devices Meeting (IEDM)*, 1998, pp. 540–543, an idea is described which utilizes an extremely shallow diffusion layer in the n-well under the field oxide. The diffused layer is formed by high energy implantation through the field oxide. This art however, required an additional processing mask level, adding to the cost and complexity of the integrated process. This reference also suffers from the problem that the value of the inductance is a function of frequency.

SUMMARY OF INVENTION

To summarize, prior inventions suffer from several problems: Special complicated and expensive processing is required to produce the inductance, high resistivity substrates are required to reduce coupling to the inductor, and the inductance is not constant over a sufficiently wide range of frequencies.

As one would expect, it is desirable that the on-chip integrated inductance be manufactured without adding processing mask levels to the technology. Also it is desirable that the inductors be used for any type of substrate, high or low resistivity, with almost a constant value for a given inductor, in a wide frequency range. The invention described herein solves both problems presented by the prior art.

Thus, it is an object of the instant invention to construct an inductor/transmission line which can be integrated on any VLSI or ULSI circuit technology.

It is another object to provide an inductor which can be used on low or high resistivity substrates, without significant degradation of the quality factor.

The inductor system of this invention utilizes a microstrip transmission line which comprises a center conductor and a fairly wide metal plane below the center conductor. This metal plane is electrically grounded.

These and other objects of the invention will be described in more detail in connection with the accompanying drawings and description of the preferred embodiment of the invention.

BRIEF DESCRIPTION OF THE DRAWINGS

FIG. 14b is a simulation of the signal Amplitude vs Frequency characteristics of the bandpass filters of FIG. 14a.

DESCRIPTION OF THE PREFERRED EMBODIMENT

The microstrip transmission line of this invention is utilized in several configurations as follows:
  Straight Line Microstrip
  Meander Configuration
  Spiral Configuration.

Figure 1:
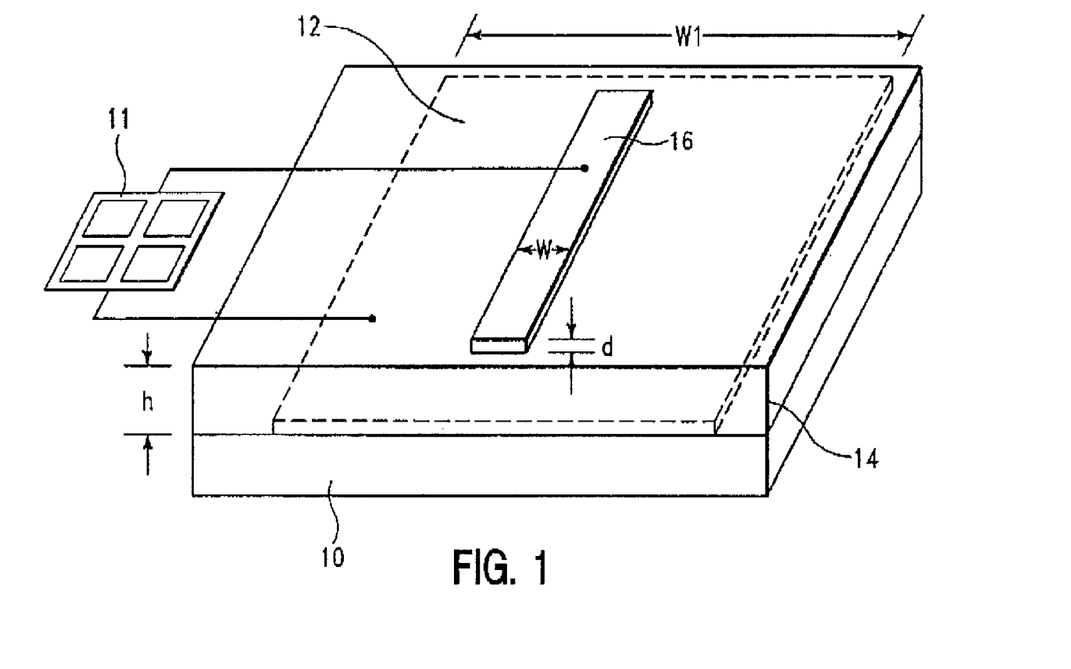
FIG. 1 is a schematic representation of a simplified straight line microstrip inductor.

The straight line microstrip configuration is shown in FIG. 1, where the center conductor 16, which is the signal carrying conductor, is made of Aluminum or Copper. Both types of metalization technologies have different advantages in terms of system optimization. Copper has lower resistivity than aluminum, but aluminum wires could be made thicker without special processing. Increasing the thickness of the center conductor is desirable to achieve a lower total resistance. The center conductor 16 has a width of W, a thickness of d, and the center conductor 16 is separated from the ground plane 12 underneath it by a distance h, which is the interlevel insulation in the integrated chip substrate 10. The integrated chip substrate 10 preferably contains a plurality of functional integrated circuits 11 to which the microstrip inductance of the invention may be electrically connected. The interlevel insulation layer 14 has a relative permittivity of $\epsilon_r$. The center conductor 16 of the microstrip transmission line inductor can be formed at the top metal level of the integrated chip, with the ground plane 12 at a lower metal level, which acts as a shield for the inductor from all lower metal levels and the substrate. The ground plane 12 has a width of W1. The ground plane 12 can also be made of either copper or aluminum. The straight microstrip line of FIG. 1 offers a simplest utilization of the invention. The interlevel insulation layer 14 has a relative permittivity of $\epsilon_r$. The center conductor 16 of the microstrip transmission line inductor can be formed at the top metal level of the integrated chip, with the wide metal plane 12 at a lower metal level, which acts as a shield for the inductor from all lower metal levels and the substrate. The lower shield ground plane has a width of W1. T lane can also be made of either copper or aluminum. The straight microstrip line of FIG. 1 offers a simplest utilization of the invention.

Figure 2:
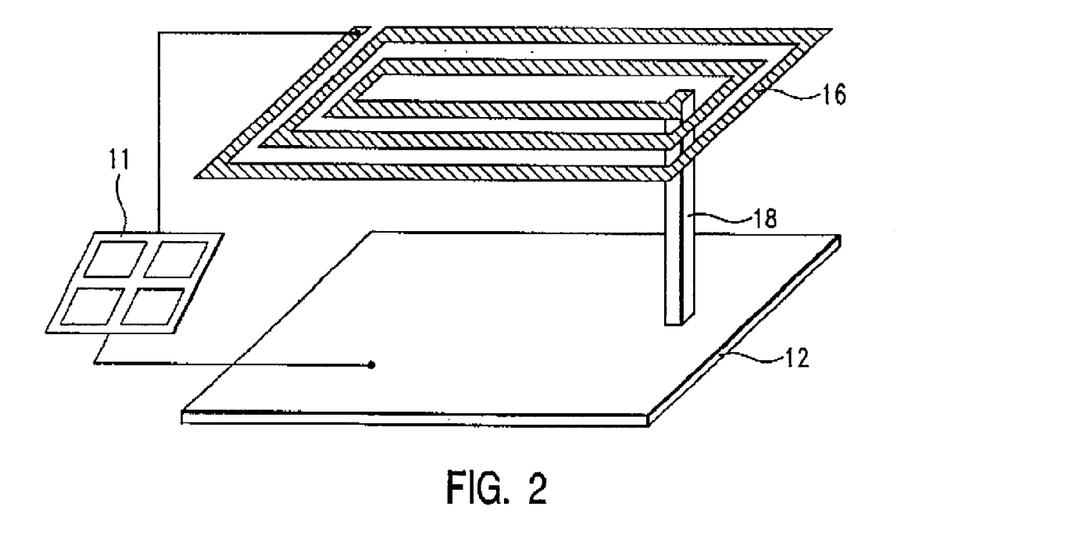
FIG. 2 is a schematic representation of a microstrip inductor using a spiral transmission line.

The spiral form of the microstrip inductor which is shown schematically in FIG. 2 offers an alternative configuration for layout which is more compact than the straight microstrip configuration. Like reference numbers represent like components in FIG. 1.

Figure 3:
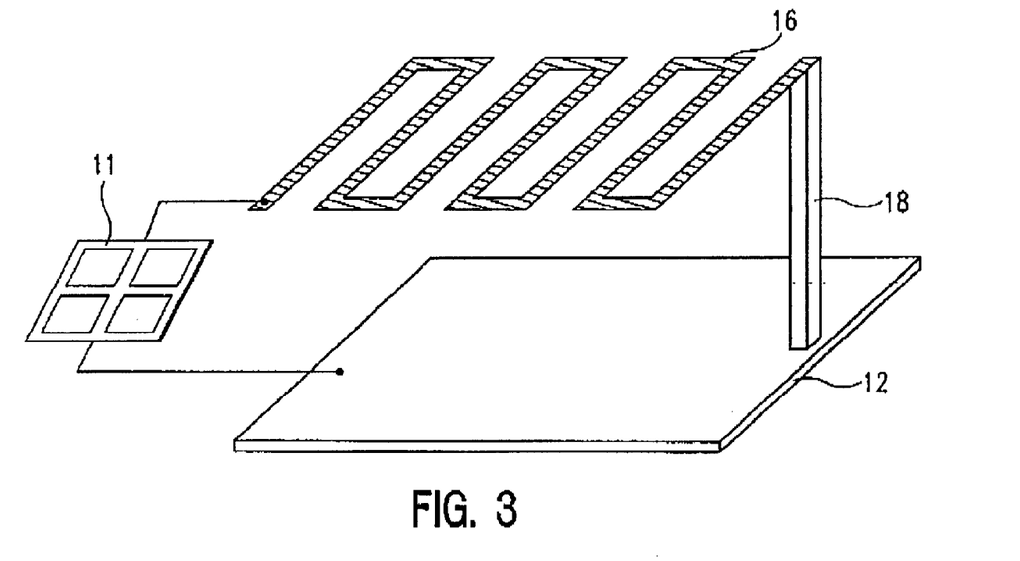
FIG. 3 is a schematic representation of a microstrip inductor in a meander configuration.

Another utilization of the invention is the meander configuration which is shown in FIG. 3.

For use as an inductor, the center conductor 16 of the transmission line is shorted, i.e. electrically connected to the lower ground metal plane. As will be shown in the next sections, this feature is key to producing an inductance value which is independent of frequency over a specified design frequency range.

Figure 4:
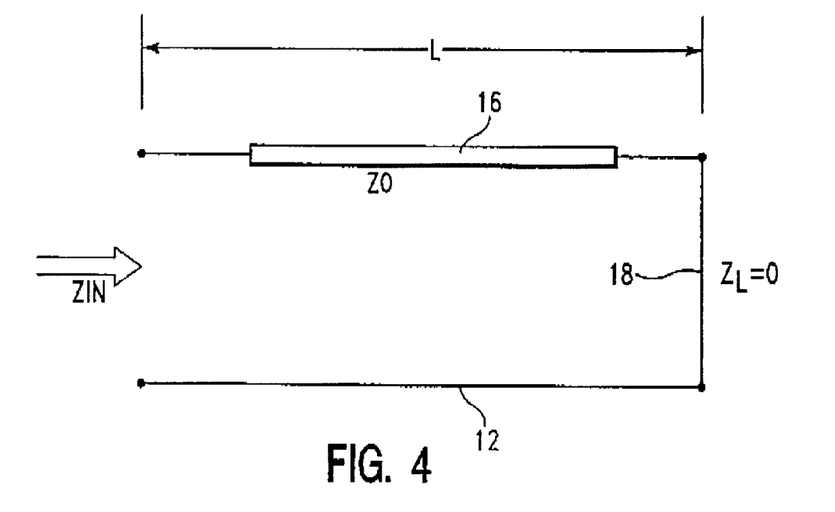
FIG. 4 is a circuit schematic of a short circuit terminated linear microstrip inductor.

A simplified form of the invention is shown in FIG. 4, where the microstrip or spiral microstrip transmission line is represented by two straight lines and they are shorted at one end (far end). The microstrip line 16 can be shorted to ground plane by any vertical interconnect, such as a stud 18 or a series of stud/line interconnections. A single stud-like connector provides the lowest resistance for the shorting connector.

The input impedance (Zin) of a transmission line in general, at the other end, is given by the following expression:

$$Zin = Z0 \times ZN/ZD \quad (1)$$

where, Z0 is the characteristic impedance of the transmission line, and ZN, and ZD are given by:

$$ZN = [ZL \; COS \; H(\lambda L)] + [Z0 \; SIN \; H(\lambda L)] \quad (2)$$

and, $$ZD = [Z0 \; COS \; H(\lambda L)] + [ZL \; SIN \; H(\lambda L)] \quad (3)$$

ZL is the load impedance at the far end, L is the length of the transmission line, and λ is the generally complex propagation constant, which is given by:

$$\lambda = \alpha + j\beta \quad (4)$$

where $\alpha$ is the attenuation constant, and $\beta$ is the phase constant which is given by:

$$\beta = 2\pi/\lambda$$

where $\lambda$ is the wavelength which is given by:

$$\lambda = C/\{f \times (\epsilon_{eff} * 0.5)\} \tag{5}$$

thus, $$\beta = 2\pi \times f \times (\epsilon_{eff} * 0.5)/X \tag{6}$$

where C is the speed of light ($3 \times 10^8$ meter/sec), f is the frequency of the input signal, $\epsilon_{eff}$ is the effective relative dielectric constant of the microstrip transmission line, and $\epsilon_r$ is the relative dielectric constant of the dielectric medium between the two conductors, which for $SiO_2$ is equal to 3.8. As will be seen later, $\epsilon_{eff}$ may not be equal to $\epsilon_r$ depending on the configuration of the transmission line. As shown in FIG. 4, for this invention, the two transmission lines are shorted at the far end, thus:

$$ZL=0$$

Substituting in equations (1), (2) and (3), one obtains the following for Zin:

$$Zin = Z0 \times TAN\, H(\lambda L) \tag{7}$$

TAN $H(\lambda L)$ can be written as follows:

$$TAN\, H(\lambda L) = [SIN\, H(2\alpha L) + j\, SIN(2\beta L)]/[COS\, H(2\alpha L) + COS(2\beta L)] \tag{8}$$

Substituting equation (8) into equation (7), the imaginary component of Zin can be written as follows:

$$I_m[Zin] = j\, Z0 \times SIN(2\beta L)]/[COS\, H(2\alpha L) + COS(2\beta L)\} \tag{9}$$

Under the appropriate design conditions, equation (9) gives an inductive component for the input impedance, and the effective input inductance $L_{eff}$ can be written as follows:

$$L_{eff} = (Z0/\omega) \times SIN(2\beta L)/[COS\, H(2\alpha L) + COS(2\beta L)\} \tag{10}$$

For small values of ($\alpha L$), i.e lossless transmission lines, $$Zin = Z0 \times TAN\, H(j\, \beta L) = j\, Z0\, TAN(\beta L) \tag{11}$$

The characteristic impedance, Z0, is generally given by:

$$Z0 = [(R_d + j\omega L_d)/(G_d + j\omega C_d)]^{0.5} \tag{12}$$

where $R_d$, $L_d$, $G_d$, and $C_d$ are, respectively, the transmission line distributed resistance, inductance, conductance, and capacitance, per unit length of the line. Z0 is generally complex and approaches pure real values at high frequencies, where $R_d << \omega L_d$, and $G_d << \omega C_d$.

The propagation constant $\gamma$ is generally complex, and its real component $\alpha$ increases with square root of frequency due to skin effect. Its imaginary component $\beta$ also increases with increasing frequency.

For small values of ($\beta L$), TAN($\beta L$) is approximately equal to ($\beta L$). The criterion we set in our invention is that the maximum value for the product ($\beta L$) is such that the effective input inductance does not change by more than 10% in the corresponding ranges for frequency and transmission line lengths. Substituting with equation (6) in equation (11), and for lossless transmission lines, one obtains:

$$Zin = j\, Zo \times TAN(2\pi f \times \epsilon_{eff}^{0.5} \times L/C) \tag{13}$$

Equation (13) gives an effective input inductance for the case of small transmission losses and at sufficiently high frequencies as:

$$L_{eff} = Z0\, TAN[2\pi f \times \epsilon_{eff}^{0.5} \times L/C]/2\pi f \tag{14}$$

Equation (14) indicates that the effective input inductance is proportional to both the length, and characteristic impedance of the transmission line. As was indicated earlier, an important feature and advantage of this invention is that the effective input inductance of the transmission line is independent of frequency, provided that the frequency is within a certain design operating range. This specified frequency range is such that the effective inductance does not change by more than 10% throughout the frequency range. The upper frequency range for this to be valid will depend on the length L of the transmission line. For any given design conditions, the actual expression for the effective inductance is given by equation (10).

At any desired operating frequency, f, for this invention, such that the effective inductance does not change by than 10%, the maximum length, $L_1$ for the transmission length can then be obtained from equation (7) and is given by:

$$[TAN\{\beta L_1\} - (\beta L_1)]/(\beta L_1) = 0.1 \tag{15}$$

Similarly, for a given length of the transmission line, the maximum frequency for the range, within which the inductance does not change by more than 10% can be found.

To a close approximation the effective relative dielectric constant is given by the following expression ( from C. W. Davidson, *Transmission Lines for Communications,* Section 1.3.3, pp. 15–18)

$$\epsilon_{eff} = K1 + K2 \tag{16}$$

where K1 is given by:

$$K1 = (\epsilon_r + 1)/2 \tag{17}$$

and K2 is given by:

$$K2 = [(\epsilon_r - 1)/2] \times [1 + (10h/W)]^{-0.5} \tag{18}$$

In the above, the effective relative dielectric constant is different from the relative dielectric constant because of the non symmetric configuration of the microstrip transmission line with respect to the center conductor. For a typical CMOS technology the minimum value for h is about 1.0 $\mu m$ for the thickness of one interlevel dielectric layer. This is the minimum value because the center conductor and the ground plane have to be separated by at least one interlevel dielectric area. It is important to note that under this configuration of h equal to 1 $\mu m$, this represents the smallest volume required for the inductor configuration on the integrated circuit. Increasing h will yield higher values for the characteristic impedance and hence for the inductance and quality factor.

($\beta L$) is proportional to the frequency of operation, i.e. becomes larger at high frequencies. It should be noted that equation (15) gives the maximum length of the transmission line required to achieve the objective of this invention which is a constant inductance within 10%. The quality factor (Q), for the inductor system is given by:

$$Q = 2\pi \times f \times L_{eff}/Re[Zin] \tag{19}$$

where Re [Zin] is the real component of the input impedance. From equation (8) one obtains:

$$Re[Zin] = Z0 \times SIN\ H(2\alpha L)/[COS\ H(2\alpha L)] \qquad (20)$$

To achieve high inductance and high quality factor, the characteristic impedance need to be as high as possible, In choosing between various options for the transmission line, the best choice is the type that yields the highest characteristic impedance with the lowest coupling to the substrate for an identical line width and length.

It is important that the line width be constant when comparing different transmission line types because the series resistance contributes to power loss in the line (narrower lines have higher resistance and more power loss). In order to illustrate this point, we considered the following different ways for the transmission line to achieve the desired inductance:

1) Microstrip Line (signal conductor over a ground plane),
2) Coplanar Wave Guide (CPW) (signal conductor with two symmetrical grounds, one on either side of the line on the same level),
3) Stripline (signal conductor between an upper and a lower ground plane).
4) Coplanar Hybrid (coplanar wave guide as in 2), but with a ground plane underneath to shield the substrate from the line.

The best choice is the type that yields the highest characteristic impedance with the least coupling to the substrate. Coplanar wave guide achieves the highest impedance when realized on a silicon substrate, but has significant coupling to the substrate. The next highest impedance can be realized with a microstrip transmission line. This approach also allows for significant shielding of the substrate from the signal line. The next highest impedance can be achieved by a coplanar hybrid, but this has no significant shielding advantage over plain microstrip. Finally, stripline yields the lowest achievable impedance while providing the best shielding, although it is not significantly better than microstrip. Therefore, the best transmission line configuration to choose for this application is a microstrip line.

The inductance and quality factor as given by equations (10), (19), and (20), are determined by computer simulation algorithms which are based on calculating the distributed elements of the transmission line and the characteristic impedance according to equation (12). The results of the simulations are then compared with experimental results. The design case illustrated here for a technology with aluminum metalization, is given below:

W=5.0 μm
=h=7.14 μm
W1=40 μm or more
d=2.0 μm

The inductance and quality factor as given by equations (10), (19), and (20), are determined by computer simulation algorithms which are based on calculating the distributed elements of the transmission line and the characteristic impedance according to equation (12). The results of the simulations are then compared with experimental results. The design case illustrated here for a technology with aluminum metalization, is given below:

W=5.0 μm
h=7.14 μm
W1=40 μm or more
d=2.0 μm
Line Length, L=variable, L is in the range of 500 to 2,000 micrometers, Typical case is L=750 μm
Relative Dielectric Constant, $\epsilon_r$=3.8

Inductance=0.22 nH for L=750 μm, constant within 10% in the frequency range of 8 GHz to 35 GHz.
Effective Line Resistance, Re[Zin]=5 ohms at 35 MHz
Quality Factor, Q=10.5 at 35 GHz From the above results, we can summarize the advantages achieved by the inductor of this invention:

A Microstrip transmission line with a shield ground plane.
Inductance independent of substrate resistivity
Quality factor independent of substrate resistivity
System could be used for low and high values of substrate resistivity.
Inductance independent of frequency for a given length of transmission line and in a specified frequency range.
No additional processing mask levels.
Flexibility with system could be achieved in various configurations depending on desired level of performance and simplicity.
Operability in the very high frequency range and suitability for VLSI and ULSI CMOS integrated technologies.

While the invention has been described in terms of specific embodiments, those skilled in the art will recognize that variations from the specific description herein may be made without departing from the spirit of the invention. For example, other conductor systems can be used with like results, as can other dielectric and/or semiconductor materials.

What is claimed is:

1. A semiconductor device comprising:
    a semiconductor substrate;
    a ground plane extending over a predetermined area of a first surface of said substrate; and
    a microstrip transmission line, having first and second ends, insulatingly spaced from, and being parallel to, said ground plane, wherein said ground plane is located between said first surface of said substrate and said microstrip transmission line;
    further wherein said first end of said microstrip transmission line is connected to said ground plane and said second end is connected to an external circuit, whereby the electrical characteristic of said microstrip transmission line and said ground plane act as an inductor for said external circuit at frequencies in excess of one gigahertz.

2. The semiconductor device of claim 1 wherein said semiconductor substrate includes integrated circuits coupled to said external circuit.

3. The semiconductor device of claim 1 wherein said microstrip transmission line comprises a continuous portion of conductive interconnect having a length L and a substantially constant width W.

4. The semiconductor device of claim 1 wherein said microstrip transmission line comprises a conductor having a straight line pattern.

5. The semiconductor device of claim 1 wherein said microstrip transmission line comprises a conductor having a spiral pattern.

6. The semiconductor device of claim 1 wherein said microstrip transmission line comprises a conductor having a meandering pattern.

7. The semiconductor device of claim 1 wherein said microstrip transmission line comprises metallurgy selected from the group comprising aluminum-based and copper-based conductors.

8. The semiconductor device of claim 1 wherein said ground plane comprises metallurgy selected from the group comprising aluminum-based and copper-based conductors.

9. The semiconductor device of claim 3 wherein L is in the range of 500 to 2,000 micrometers.

10. The semiconductor device of claim 1, wherein said first end is connected to said ground plane by a low resistance shunt.

11. A semiconductor device comprising:

a semiconductor substrate;

a ground plane extending over a predetermined area of said substrate;

a microstrip transmission line, having first and second ends, insulatingly spaced from, and being parallel to, said ground plane, said microstrip transmission line comprises a continuous portion of conductive interconnect having a length L and a substantially constant width W;

said microstrip transmission line being terminated at one end with a low resistance shunt; and a circuit connected to said ground plane and the other end of said microstrip transmission line; whereby the electrical characteristic of said microstrip transmission line and said ground plane act as an inductor to said circuit at frequencies in excess of one gigahertz, wherein the inductance of said inductor is about 0.22 nanohenry±10% in the frequency range of about 8 gigahertz to 35 gigahertz when L is about 750 micrometers.

* * * * *

UNITED STATES PATENT AND TRADEMARK OFFICE
CERTIFICATE OF CORRECTION

PATENT NO.     : 6,714,113 B1
DATED          : March 30, 2004
INVENTOR(S)    : Wagdi Abadeer, Robert A. Groves and Patrick Hansen It is certified that error appears in the above-identified patent and that said Letters Patent is hereby corrected as shown below:

Column 4,
Line 19, cancel the text beginning with "The interlevel insulation" to and ending with "utilization of the invention."
Lines 57, 60, 63 and 66, "$\lambda$", each occurrence should read -- $\gamma$ --.

Column 5,
Lines 28, 29 and 31, "$\lambda$", each occurrence should read -- $\gamma$ --.

Column 7,
Line 40, cancel the text beginning with "The inductance and quality factor" to and ending "d=2.0 $\mu$m".

Figure 5:
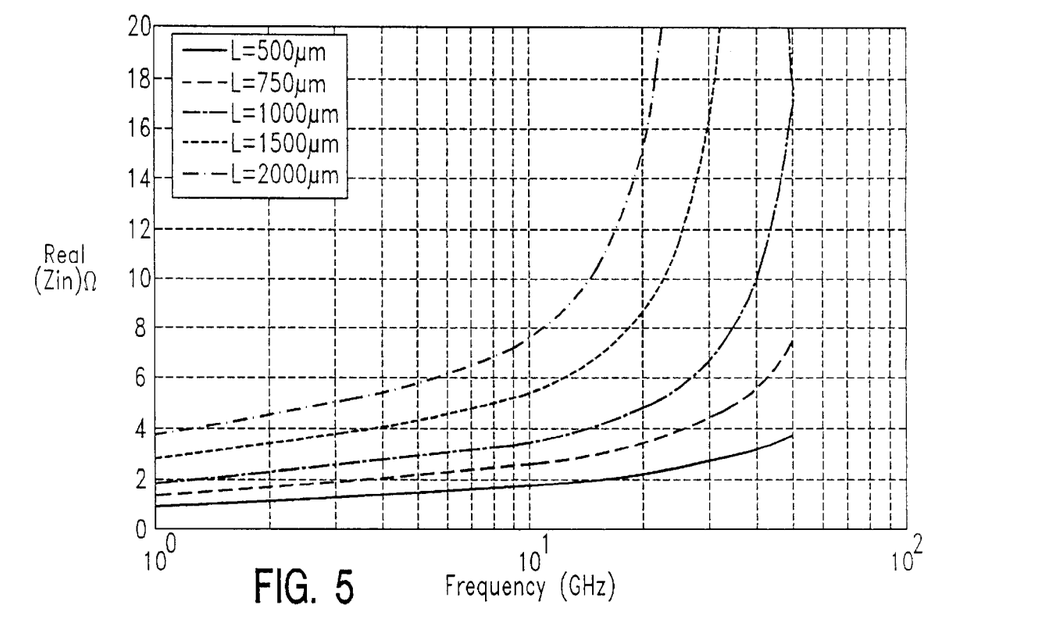
FIG. 5 shows the simulation results of the Real Component, Real[Zin] ohms, of the Input Impedance vs Frequency, in gigahertz (GHz), for a shorted microstrip transmission line formed using aluminum-copper metallization of FIG. 4 having dimensions: AlCu thickness=4.0 microns, width=5.0 microns and a dielectric thickness of 7.14 microns.
Figure 6:
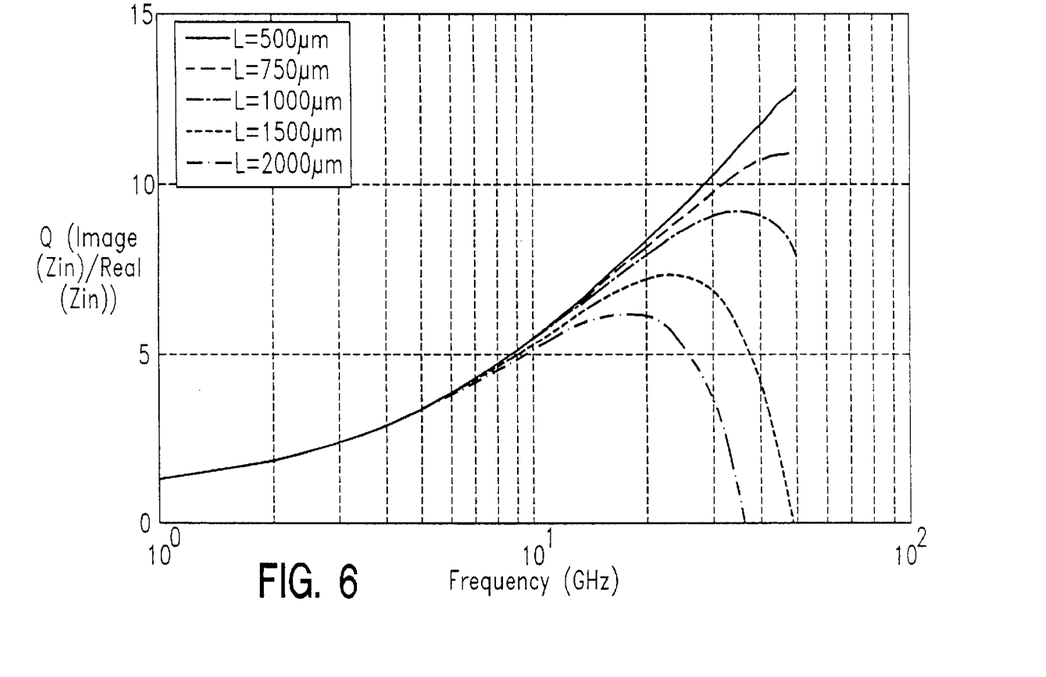
FIG. 6 shows the simulation results of the Quality factor vs Frequency for the shorted microstrip transmission line used in FIG. 4.
Figure 7:
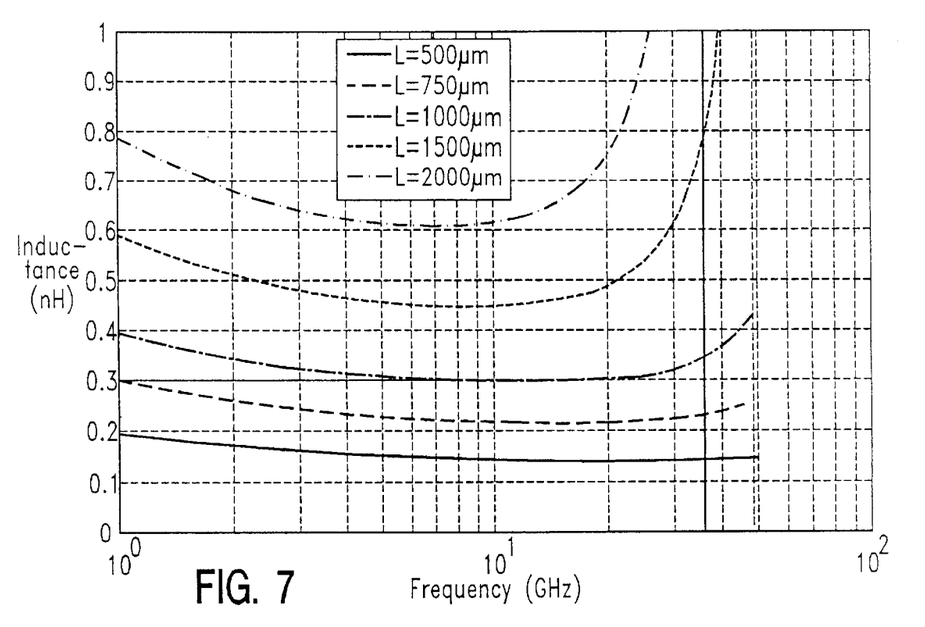
FIG. 7 shows the simulation results of the Effective Input Inductance (nano-Henrys) vs Frequency for the shorted microstrip transmission line of FIG. 4.
Figure 8:
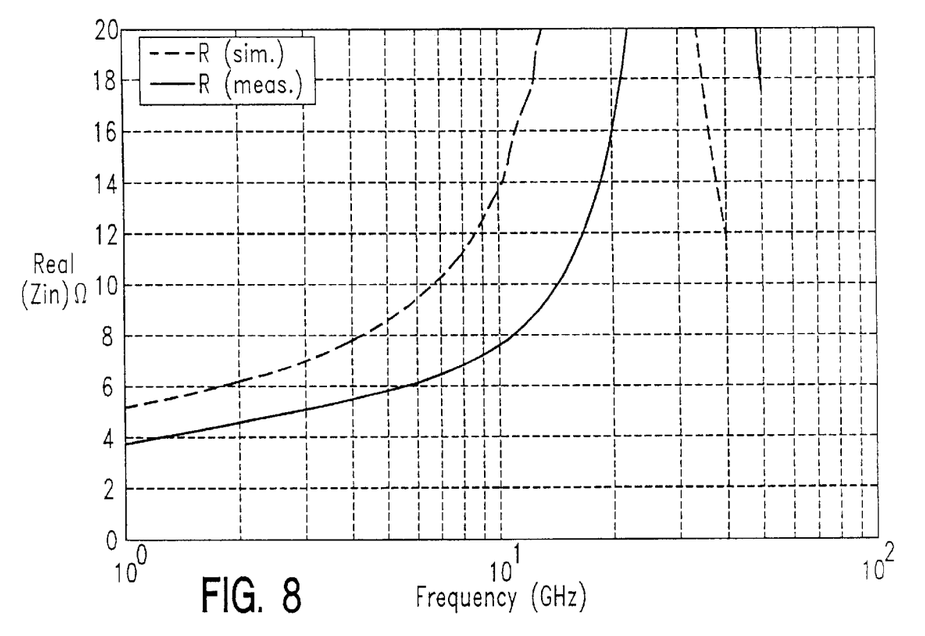
FIG. 8 shows the simulated and experimental results of the Real Component, Real[Zin], of the Input Impedance vs Frequency of the microstrip transmission line of FIG. 4
Figure 9:
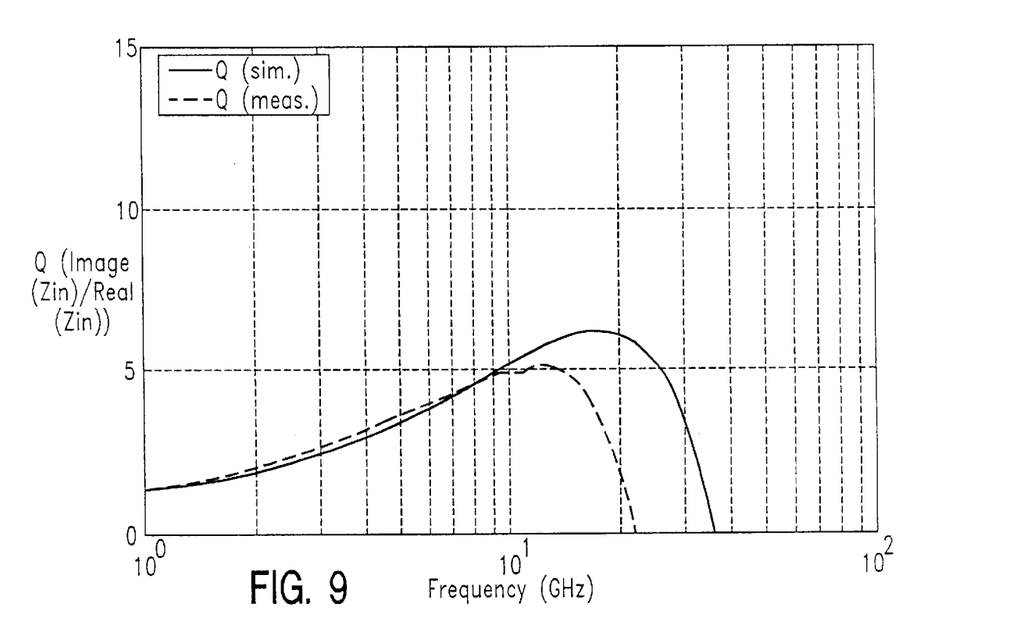
FIG. 9 shows the simulated and experimental results of the Quality Factor [Q] vs Frequency of the microstrip transmission line of FIG. 4.
Figure 10:
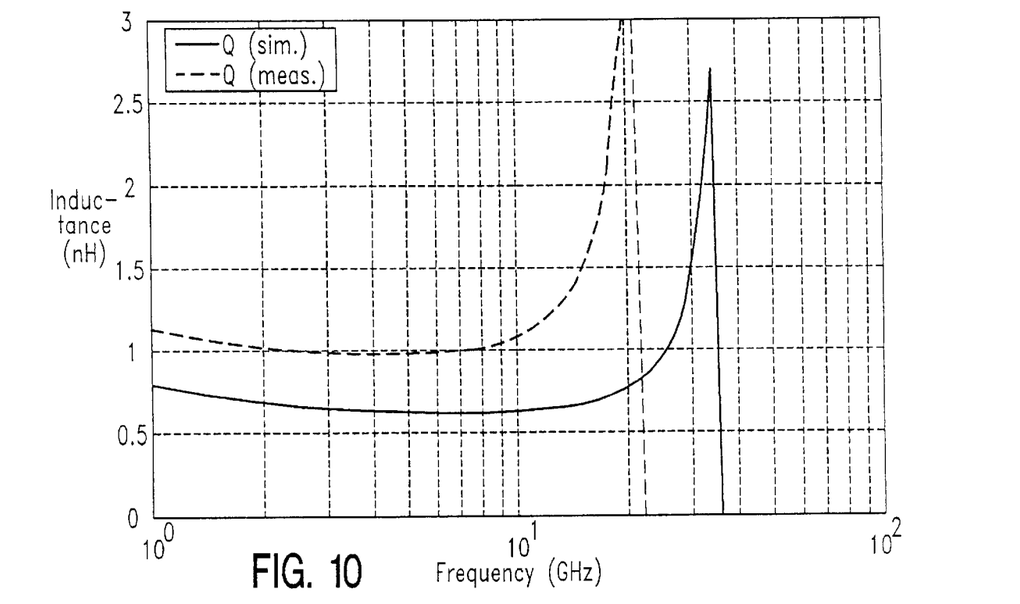
FIG. 10 shows the simulated and experimental results of the Effective Input Inductance vs Frequency of the microstrip transmission line of FIG. 4.
Figure 11:
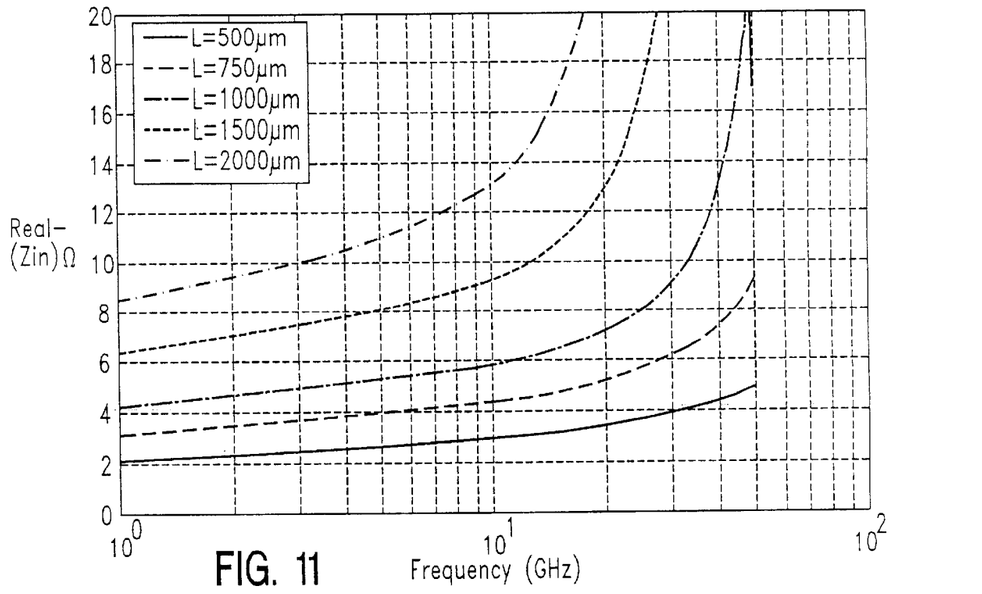
FIG. 11 shows the simulation results of the Real Component of Input Impedance vs Frequency for a copper-based metallurgy having dimensions: copper thickness=0.83 microns, width=5.0 microns and dielectric thickness of 2.6 microns.
Figure 12:
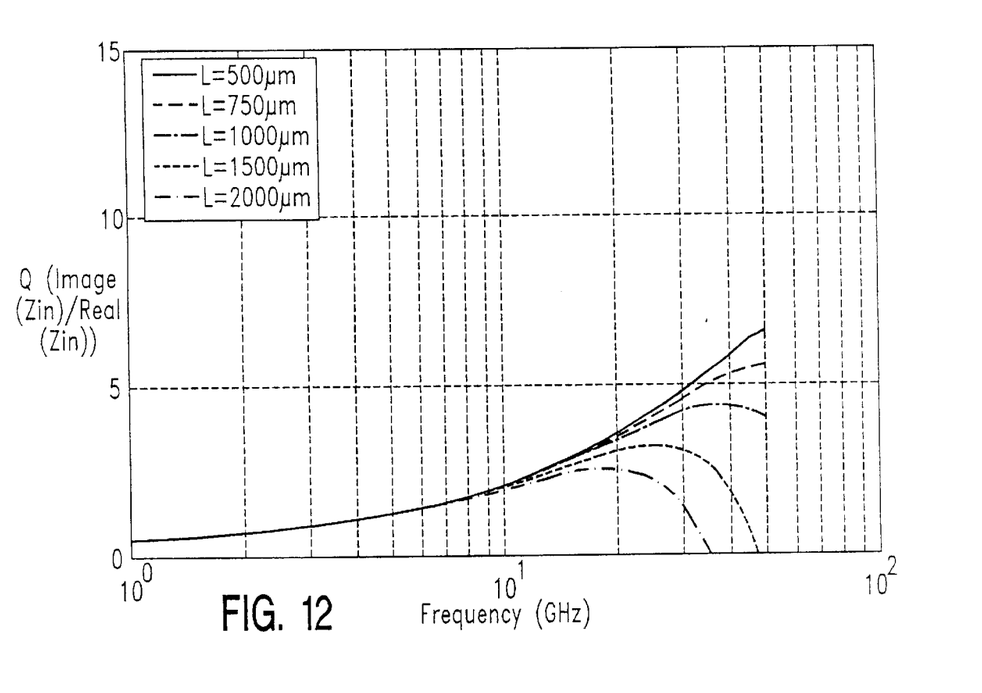
FIG. 12 shows the simulation results of the Quality Factor vs Frequency of the microstrip transmission line modeled in FIG. 11.
Figure 13:
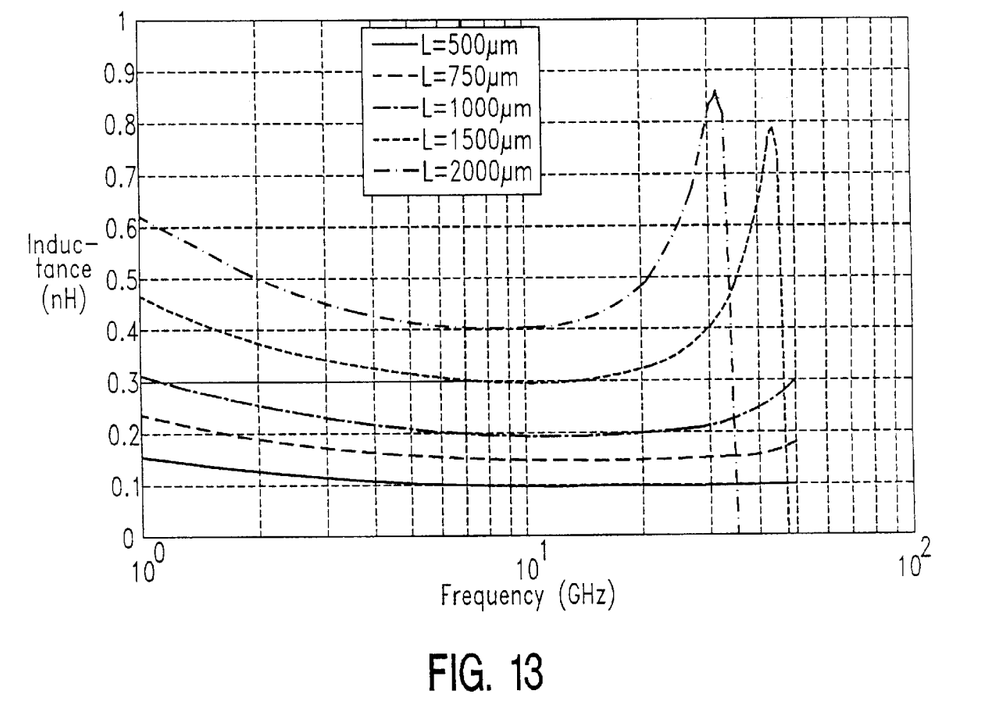
FIG. 13 shows the simulation results of the Effective Input Inductance vs Frequency for the microstrip transmission line of FIG. 11.

Column 8,
Line 4, insert the following text:

The results of the simulations are shown in FIGs. 5, 6, and 7, respectively, for the Re[*Zin*], quality factor (Q), and the effective input inductance $L_{eff}$, for the design case illustrated above. FIGs. 8, 9 and 10 give the simulation results, for a 2200 μm long microstrip line, vs actual measured values, for Re[Zin], Q, and Leff, respectively. These figures show reasonable agreement between measurement and simulation. From the results of FIGs. 6 and 7, it is observed that the inductance is almost constant within a certain design frequency range, as indicated in the design objectives. For example, for a transmission line length of 750μm, the inductance has a reasonably constant value of about 0.22nH, constant within 10% for a frequenc range extending from about 8GHz to about 35GHz. In the same frequency range, the quality factor has a minimum value of about 5 and a maximum value of about 10.5. FIGs. 11, 12, and 13, illustrate a comparison between the design case of this invention and another case for a technology with copper metalization, with a value of 2.6μm for the dielectric spacing, *h*. The

UNITED STATES PATENT AND TRADEMARK OFFICE
CERTIFICATE OF CORRECTION

PATENT NO. : 6,714,113 B1
DATED : March 30, 2004
INVENTOR(S) : Wagdi Abadeer, Robert A. Groves and Patrick Hansen

Figure 14A:
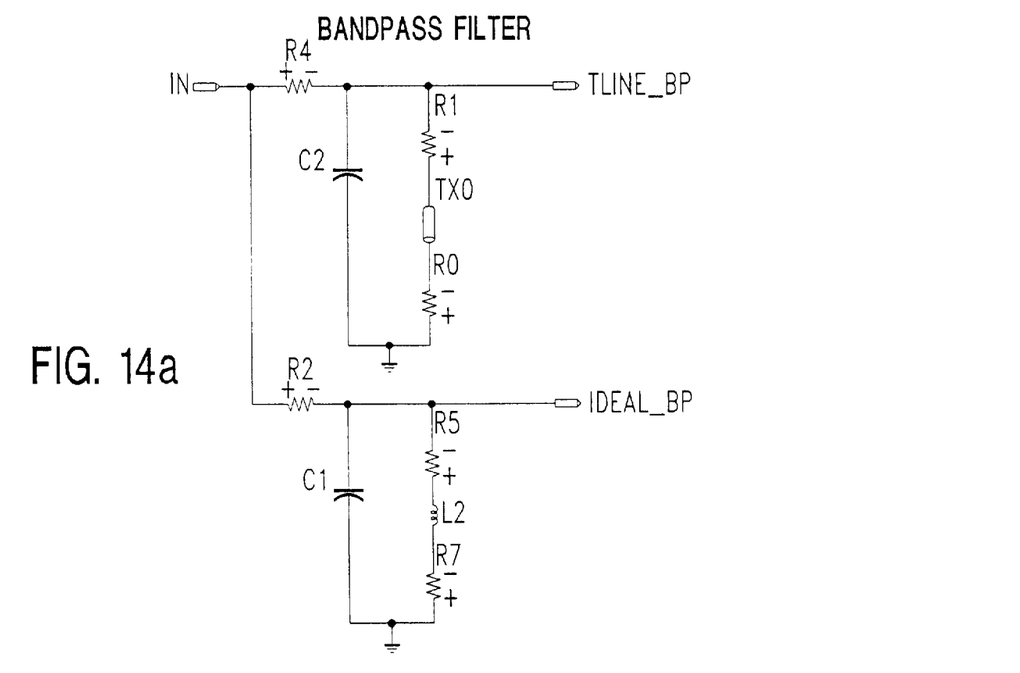
FIG. 14a is a circuit schematic of a bandpass filter using both the microstrip transmission line [TLINE] of the invention and an Ideal circuit [IDEAL] using an inductor [L2].
Figure 14B:
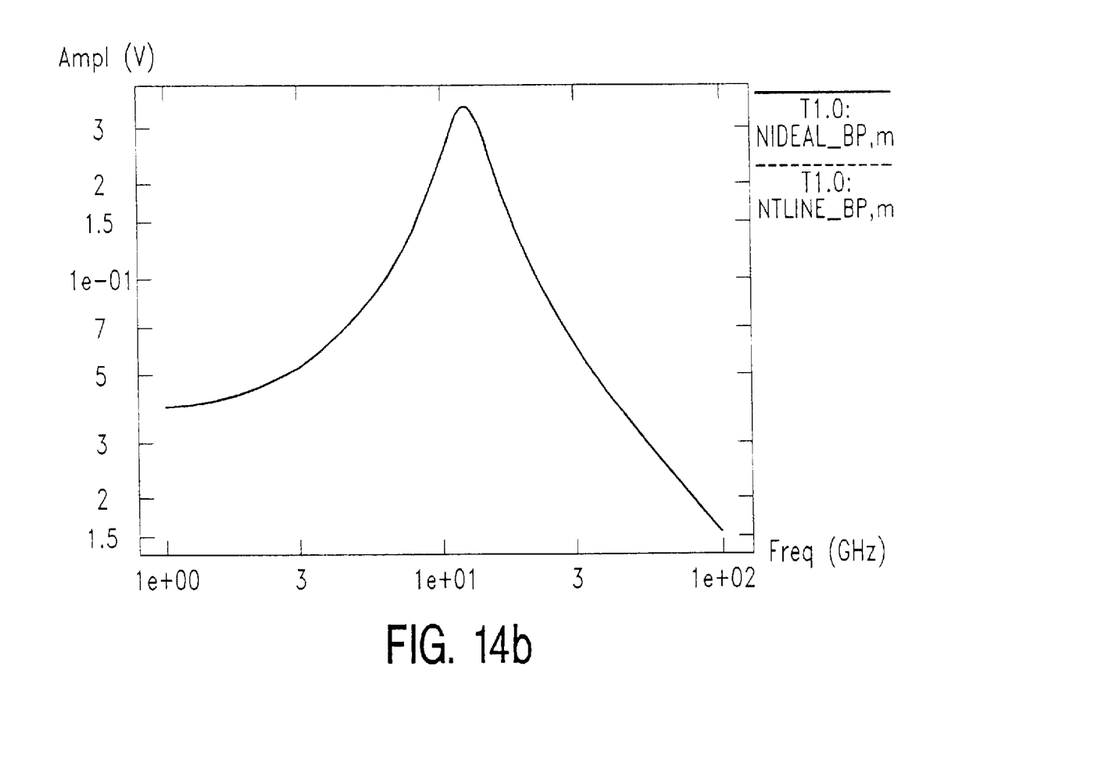
Figure 15A:
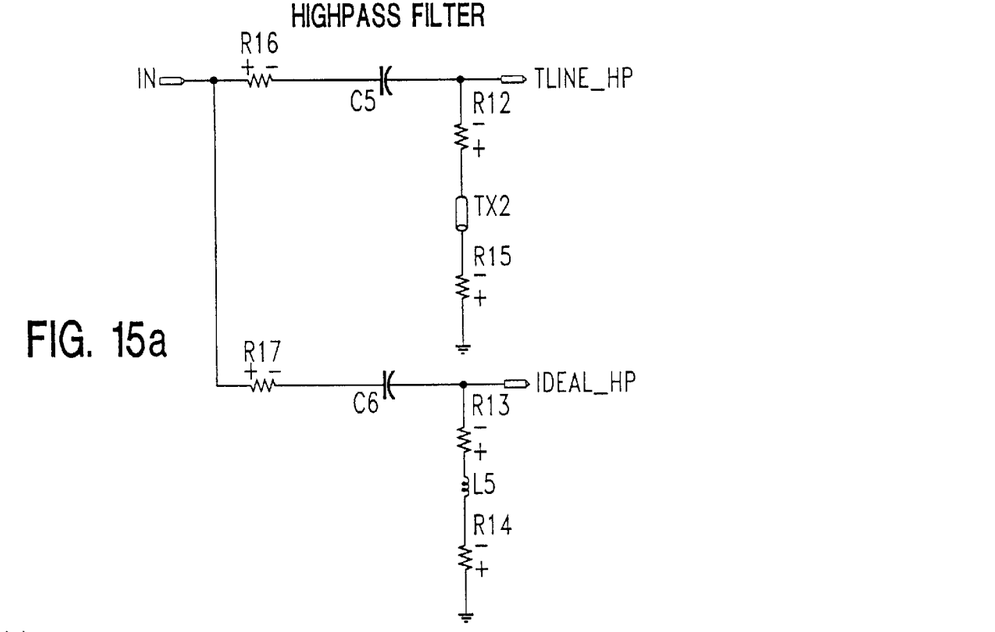
FIGS. 15a and 15b show the circuit schematic and simulation comparison results of the invention for a high pass filter.
Figure 15B:
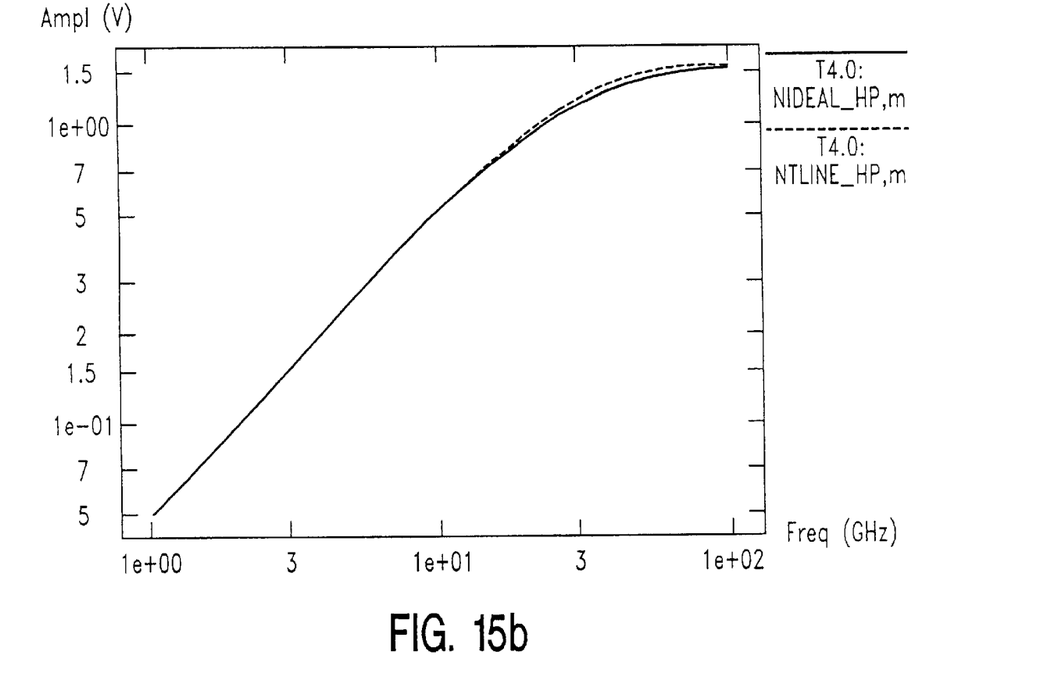
Figure 16A:
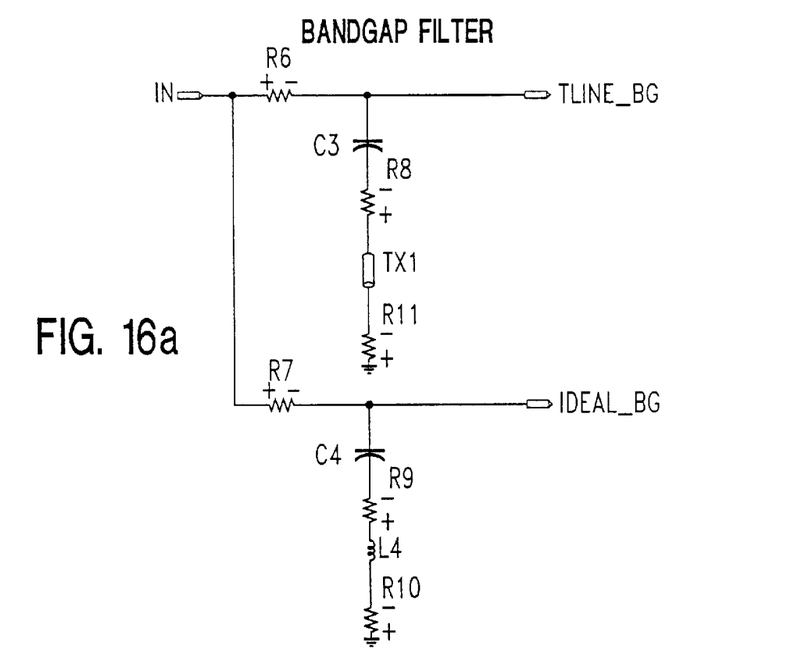
FIGS. 16a and 16b show the circuit schematic and simulation comparison results of the invention for a band gap filter.
Figure 16B:
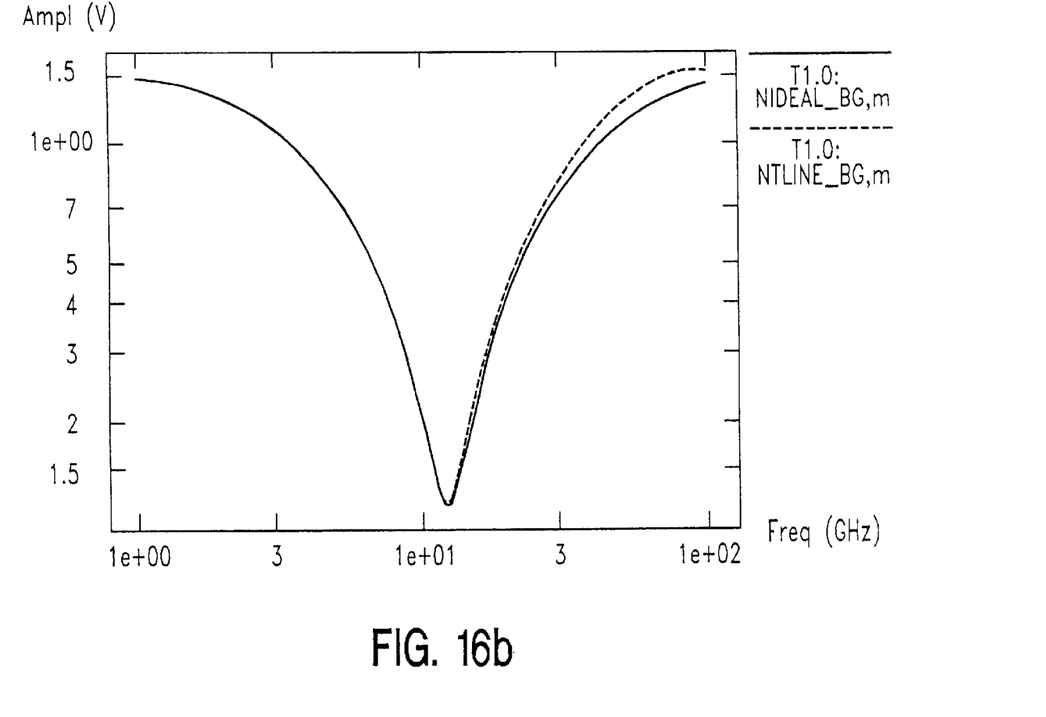

It is certified that error appears in the above-identified patent and that said Letters Patent is hereby corrected as shown below:

Column 8 (cont'd), results show comparable values for $L_{eff}$, and Q as obtained by two different technologies. Utilizing dielectric insulation with low values of relative dielectric constant, could achieve higher values of the quality factor. For example, lowering the relative dielectric constant from 3.8 to 2.6, would result in an increase of about 10% in Q. FIGs. 14a, 15a and 16a, respectively show the circuits schematics for Band Pass, High Pass, and Band Gap filters using the shorted mircostrip transmission line of this invention. FIGs. 14b, 15b, and 16b, respectively, show the simulated results of the amplitude vs frequency responses for the three filter types.

Signed and Sealed this

Twenty-seventh Day of September, 2005

JON W. DUDAS
*Director of the United States Patent and Trademark Office*